(12) United States Patent
Venugopalan

(10) Patent No.: US 7,022,550 B2
(45) Date of Patent: Apr. 4, 2006

(54) METHODS FOR FORMING ALUMINUM-CONTAINING P-CONTACTS FOR GROUP III-NITRIDE LIGHT EMITTING DIODES

(75) Inventor: Hari S. Venugopalan, Somerset, NJ (US)

(73) Assignee: GELcore LLC, Valley View, OH (US)

( * ) Notice: Subject to any disclaimer, the term of this patent is extended or adjusted under 35 U.S.C. 154(b) by 0 days.

(21) Appl. No.: 10/819,740

(22) Filed: Apr. 7, 2004

(65) Prior Publication Data

US 2005/0224990 A1    Oct. 13, 2005

(51) Int. Cl.
*H01L 21/44* (2006.01)

(52) U.S. Cl. .......................... 438/108; 438/22; 438/25; 438/26; 438/64; 438/604

(58) Field of Classification Search ..................... None
See application file for complete search history.

(56) References Cited

U.S. PATENT DOCUMENTS

| | | |
|---|---|---|
| 6,194,743 B1 | 2/2001 | Kondoh et al. |
| 6,239,490 B1 | 5/2001 | Yamada et al. |
| 6,445,011 B1 | 9/2002 | Hirano et al. |
| 6,486,499 B1 | 11/2002 | Krames et al. |
| 6,521,914 B1 | 2/2003 | Krames et al. |
| 6,573,537 B1 | 6/2003 | Steigerwald et al. |
| 6,812,502 B1 * | 11/2004 | Chien et al. ................. 257/99 |
| 6,847,057 B1 * | 1/2005 | Gardner et al. .............. 257/99 |
| 2002/0070386 A1 | 6/2002 | Krames et al. |
| 2003/0010986 A1 | 1/2003 | Lin et al. |
| 2004/0201110 A1 * | 10/2004 | Venugopalan et al. ...... 257/778 |

FOREIGN PATENT DOCUMENTS

| WO | WO 01/47036 A1 | 6/2001 |
|---|---|---|
| WO | WO 01/47038 A1 | 6/2001 |

OTHER PUBLICATIONS

"Reliability and Failure of Electronic Materials and Devices", Milton Ohring, Environmental Damage to Electronic Products.

InxGa1-xN/AlyGa1-yN violet light emitting diodes with reflective p-contacts for high single sided light extraction, Mensz et al., Electronics Letter, Nov. 20, 1997, vol. 33, No. 24.

Jeon, et al. "Lateral Current Spreading in GaN-based Light-Emitting Diodes Utilizing Tunnel Contact Junction", Applied PHysics Letters, vol. 78, No. 21, May 21, 2001, pp. 3265-3267.

* cited by examiner

*Primary Examiner*—Andy Huynh
(74) *Attorney, Agent, or Firm*—Fay, Sharpe, Fagan, Minnich & McKee, LLP

(57) ABSTRACT

A flip-chip LED device (10) includes a plurality of group III-nitride semiconductor layers (22) defining a p/n junction and including a top p-type group III-nitride layer (28), and a p-contact (30, 30', 30'') for flip-chip bonding the top p-type group III-nitride layer. The p-contact includes an aluminum layer (32) disposed on the top p-type group III-nitride layer (28), and an interface layer (40, 66, 72, 80) disposed between the aluminum layer and the top p-type group III-nitride layer. The interface layer reduces a contact resistance between the aluminum layer (32) and the top p-type group III-nitride layer (28). The interface layer comprises one or more group III-nitride layers.

14 Claims, 5 Drawing Sheets

METHODS FOR FORMING ALUMINUM-CONTAINING P-CONTACTS FOR GROUP III-NITRIDE LIGHT EMITTING DIODES

BACKGROUND

The following relates to the lighting arts. It especially relates to flip-chip bonded group III-nitride light emitting diodes for lighting applications, and will be described with particular reference thereto. However, the following also finds application in conjunction with other types of group III-nitride light emitting diodes, and in other group III-nitride optoelectronic devices such as vertical cavity surface emitting lasers (VCSELs).

In the flip-chip mounting configuration, a light emitting diode with a light-transmissive substrate is bonded "face down" to bonding bumps of a mount, that is, with the epitaxial layers proximate to the mount and the light-transmissive substrate distal from the mount, to make electrical and mechanical connection to the mount. The flip-chip arrangement has a number of advantages, including improved thermal heat sinking due to the proximity of the front-side active layers to the heat sinking mount, and elimination of electrode shadowing losses.

In the case of group III-nitride light emitting devices, formation of an economical and robust p-type electrode that has good electrical and reflection properties is difficult. Aluminum has the advantage of being highly reflective; however, aluminum has a low work function and a large contact resistance with respect to p-type gallium nitride.

A nickel layer is sometimes inserted between the p-type gallium nitride and the aluminum to improve electrical characteristics. While having good electrical characteristics, such nickel/aluminum contacts still exhibit less than ideal reflectance characteristics due to light absorption in the nickel.

It is also known to employ silver in contacting p-type gallium nitride. However, silver is more expensive, and exhibits poor adhesion to p-type gallium nitride. Moreover, silver migration can occur under certain operating conditions. The migrating silver can short the p/n junction, causing catastrophic failure of the device.

The present invention provides a new p-contact and method for making a p-contact that overcomes the above-referenced problems and others.

BRIEF SUMMARY

In accordance with one aspect of the present application, a flip-chip LED device comprises a plurality of group III-nitride semiconductor layers defining a p/n junction and including a top p-type group III-nitride layer, and a p-contact for flip-chip bonding the top p-type group III-nitride layer. The p-contact includes an aluminum layer disposed on the top p-type group III-nitride layer, and an interface layer disposed between the aluminum layer and the top p-type group III-nitride layer. The interface layer reduces a contact resistance between the aluminum layer and the top p-type group III-nitride layer. The interface layer comprises one or more group III-nitride layers.

In accordance with another aspect of the present application, a method is provided for forming a p-contact on a top p-type group III-nitride layer of a flip-chip LED device. An interface layer is formed on the top p-type group III-nitride layer. An aluminum layer is formed on the interface layer. The interface layer reduces a contact resistance between the aluminum layer and the top p-type group III-nitride layer.

In accordance with yet another aspect of the present application, a method is provided for forming a p-contact on a top p-type group III-nitride layer of a flip-chip LED device. The top p-type group III-nitride layer is exposed to hydrochloric acid, the top p-type group III-nitride layer is exposed to a piranha solution. Subsequent to the exposing to the piranha solution, an aluminum layer is disposed on the top p-type group III-nitride layer.

Numerous advantages and benefits of the present application will become apparent to those of ordinary skill in the art upon reading and understanding the present specification.

BRIEF DESCRIPTION OF THE DRAWINGS

The application may take form in various components and arrangements of components, and in various process operations and arrangements of process operations. The drawings are only for purposes of illustrating preferred embodiments and are not to be construed as limiting the application.

DETAILED DESCRIPTION

Figure 1:
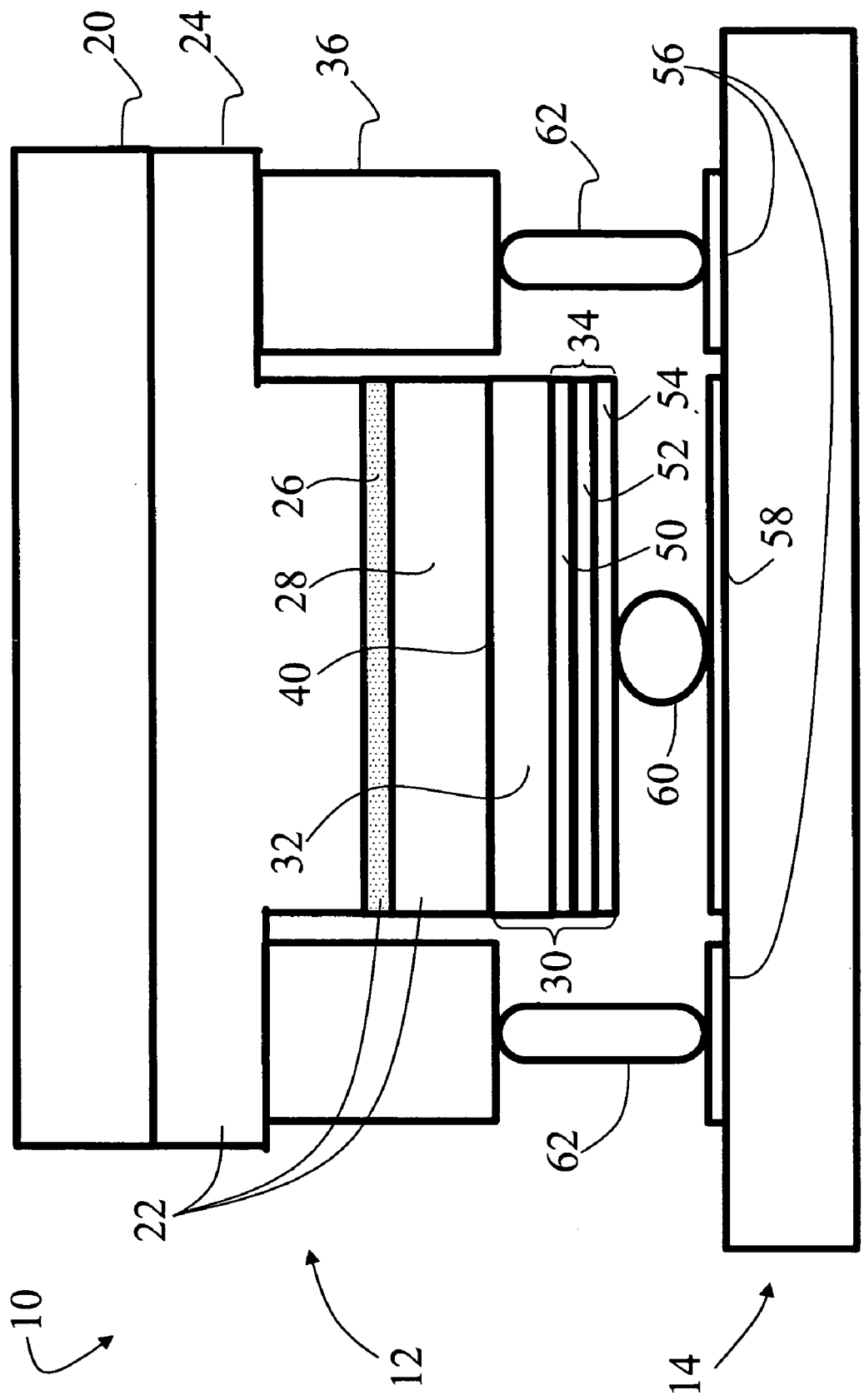
FIG. 1 shows a cross-sectional view of a flip-chip light emitting diode including an improved p-contact.

With reference to FIG. 1, a flip-chip light emitting diode device 10 includes a light emitting diode die 12 mounted in a flip-chip fashion to a mount 14. The light emitting diode die 12 includes a light-transmissive substrate 20, which is, preferably, a substantially transparent sapphire or silicon carbide substrate. A plurality of semiconductor layers 22 are formed on the light-transmissive substrate 20 by metalorganic chemical vapor deposition (also referred to as organometallic vapor phase epitaxy and similar nomenclatures), molecular beam epitaxy, chemical beam epitaxy, or another epitaxial film deposition technique. The semiconductor layers 22 are selected from the group III-nitride layers such as GaN layers, AlN layers, InN layers, and ternary and quaternary alloys thereof. In some embodiments, the substrate is used as an epitaxy template for forming the semiconductor layers 22 and is subsequently thinned or removed in the final device. In such embodiments where the substrate is ultimately thinned or removed, the substrate can be opaque.

The semiconductor layers 22 define a light emitting structure that emits light when electrically energized. Typically, the semiconductor layers 22 include an n-type group III-nitride layer 24, such as an n-type GaN layer or aluminum gallium nitride (AlGaN) layer, an active region 26, and a top p-type group III-nitride layer 28, which is typically made of gallium nitride or a aluminum gallium nitride.

Preferably, the active region 26 includes a single layer of InN, GaN, $In_xGa_{1-x}N$ (0<x<1) or the like. Optionally, the active region 26 includes a plurality of layers defining, for example, a single- or multiple-quantum well or superlattice active region. A group III-nitride-based structure typically emits light in the blue to ultraviolet spectral range, with the specific emission spectrum dependent upon the layer compositions, thicknesses, presence of certain impurities, and other features. Optionally, the semiconductor layers 22 include additional layers, such as $Al_xGa_{1-x}N$ cladding layers, a current-spreading layer, a buffer layer for promoting epitaxial growth, or the like. Optionally, the device die is another type of optoelectronic device, such as a vertical cavity surface emitting laser (VCSEL).

With continuing reference to FIG. 1, at least one p-electrode or p-contact 30 is formed on the top p-type group III-nitride layer 28. The p-contact 30 is generally a multiple layer stack, including an aluminum layer 32 and a bonding stack 34. The layers 32, 34 are deposited in a single deposition process or in multiple deposition processes. Substantially any suitable thin film deposition technique or combination of techniques, such as thermal evaporation, electron beam evaporation, sputtering, electroplating, or the like can be employed. Additionally, an n-type contact 36 is defined and the device is optionally protected with a dielectric layer (not shown) having windows through which the electrodes 30, 36 are exposed.

Typically, the top p-type group III-nitride layer 28 is a p-GaN layer, a p-AlGaN layer, or another relatively large-bandgap group III-nitride material. In one fabrication process, the semiconductor layers 22 are lithographically processed to remove portions of the active region 26 and the top p-type group III-nitride layer 28 to define device mesas, and the contact electrodes 30, 36 are formed. Aluminum has a relatively low work function, and forms a relatively high resistance contact to the top p-type group III-nitride layer 28.

The inventor has found that a surface preparation process involving exposure to hydrochloric acid (HCl) followed by exposure to a piranha solution reduces the high resistance of the aluminum/p-group III-nitride. A piranha solution is a solution of sulfuric acid, hydrogen peroxide, and optionally deionized water. In one specific embodiment, the surface preparation of the top p-type group III-nitride layer 28 includes: (i) a 10 minute exposure to pure hydrochloric acid (HCl) at 50° C. and a rinse in deionized water (DI); followed by (ii) a 2 minute exposure to a 10:1:1 sulfuric acid: hydrogen peroxide:water piranha solution. The exposure to the piranha solution is performed at room temperature; however, exothermic reactions during the exposure generally produce some heating. After exposure to the piranha solution, the surface of the top p-type group III-nitride layer 28 is again rinsed in DI. The HCl/piranha surface preparation of the top p-type group III-nitride layer results in a reduced contact resistance of the p-contact 30.

Without limiting the invention to any particular scientific theory of operation, it is believed that the HCl/piranha processing produces a modification of the surface of the top p-type group III-nitride layer 28 to form an interface layer 40 between the top p-type group III-nitride layer 28 and the aluminum layer 32 which reduces the electrical barrier between the top p-type group III-nitride layer 28 and the subsequently deposited aluminum 32. It is believed that this modified surface may involve more pure (i.e., less contaminated) surface of the top p-type group III-nitride layer 28, or may involve a chemical or structural modification of the surface of the top p-type group III-nitride layer 28. It is to be appreciated that while the interface layer 40 comprises one or more group III-nitride layers, those layers may be as thin as a few monolayers, may represent a more clean group III-nitride interface layer than is achieved without the HCl/piranha surface preparation, or may represent a roughened or otherwise structurally modified group III-nitride/aluminum interface layer.

With continuing reference to FIG. 1, the bonding stack 34 is preferably a multiple layer metal stack, including an adhesion layer 50, a diffusion-blocking layer 52, and a bonding layer 54. In one embodiment, the adhesion layer 50 is titanium, while the bonding layer 54 is gold, which provides a good bonding surface for a variety of bonding methods. For thermosonic bonding, thermocompression bonding, or the like, the diffusion-blocking layer 52 is preferably a platinum layer. For solder bonding, the diffusion-blocking layer 52 is preferably nickel. Of course, it is also contemplated that the bonding stack 34 might be a single layer, two layers, or more than three layers, which might include one or more materials such as gold, titanium, nickel, platinum, or other. Moreover, for certain types of bonding the aluminum layer 32 may provide a good bonding surface, in which cases the bonding stack 34 may be omitted.

The flip-chip light emitting diode die 12 is bonded to bonding pads 56, 58 that laterally align with the contacts 30, 36. The bonding is performed by one or more solder bumps 60, 62, by thermosonic bonding to gold-coated copper bumps, or the like. Optionally, the bonding bump 60 that secures the p-type electrode 30 is an array of bonding bumps laterally distributed to conform to the area of the p-type contact 30.

Figure 2:
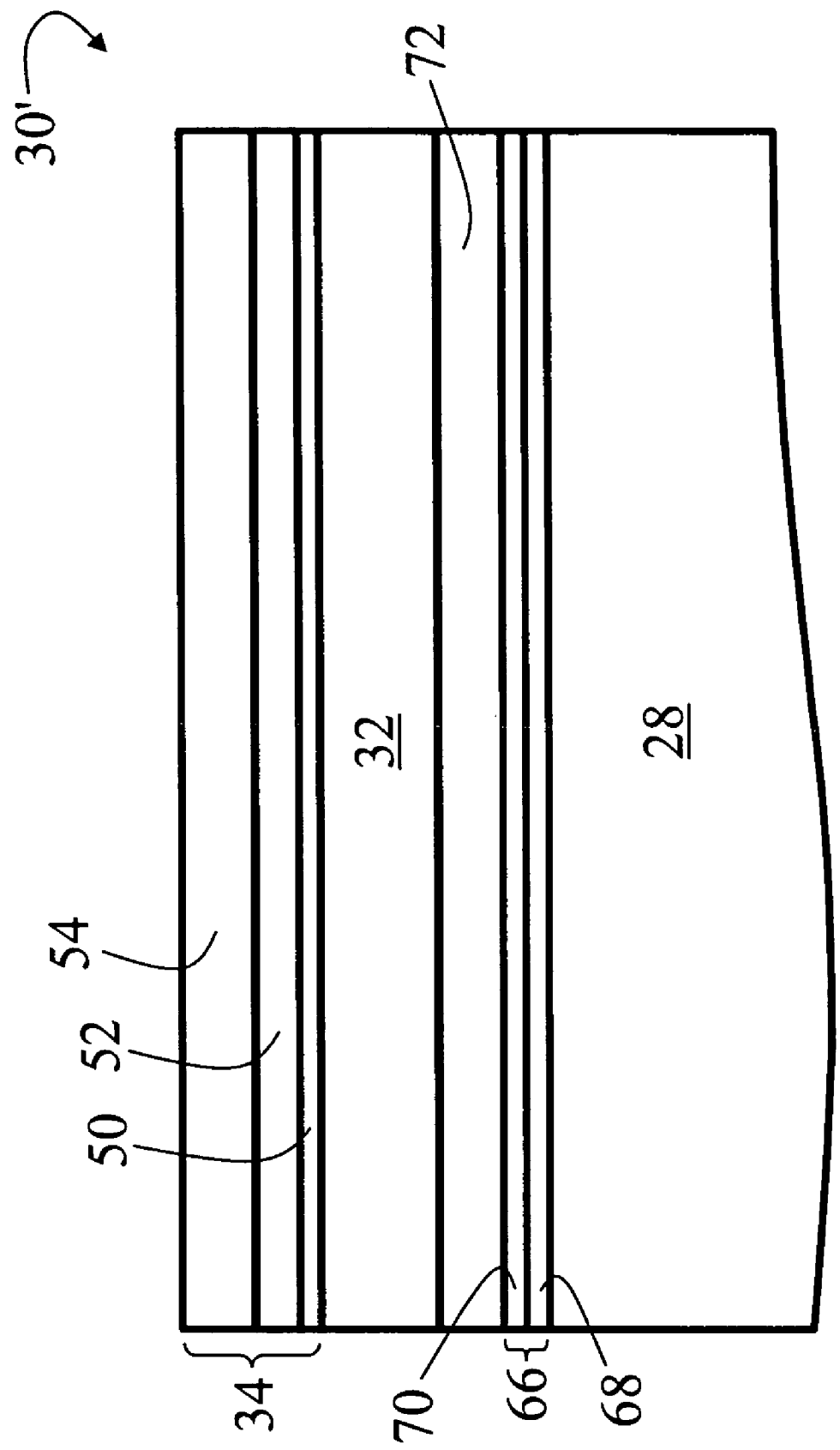
FIG. 2 shows a cross-sectional view of another embodiment of a p-contact which employs a tunnel junction.

With reference to FIG. 2, in another embodiment of the p-contact 30', the semiconductor layers 22 include a tunnel junction 66 deposited on the top p-type group III-nitride layer 28 during the growth of the semiconductor layers 22. The tunnel junction includes a degenerately doped p-type group III-nitride layer 68 deposited on the p-type group III-nitride layer 28 and a degenerately doped n-type layer 70 deposited on the degenerately doped p-type group III-nitride layer 68. These degenerately doped layers 68, 70 are preferably gallium nitride layers, although some indium can also be alloyed in to form lower bandgap indium gallium nitride degenerate layers. To promote tunneling, the tunnel junction 66 is preferably thin, such as a few nanometers thickness or less for each degenerate layer 68, 70. Hence, some increased light absorption due to indium alloying may be acceptable. An n-type group III-nitride layer 72 is deposited on the tunnel junction 66, and the aluminum layer 32 is formed on the n-type gallium nitride layer 72. The bonding stack 34 is optionally formed on the aluminum layer 32 as before. Typically, the n-type group III-nitride layer 72 is an n-GaN layer. Alloying aluminum into the n-type group III-nitride layer 72 to form AlGaN reduces optical absorption in the layer, but increases the bandgap which can degrade the quality of the electrical contact. Alloying indium into the n-type group III-nitride layer 72 to form InGaN increases optical absorption in the layer, but advantageously decreases the bandgap which generally improves the quality of the electrical contact.

The p-contact 30' operates as follows. The tunnel junction 66 provides non-rectifying and preferably quasi-ohmic electrical communication between the top p-type group III-nitride layer 28 and the n-type gallium nitride layer 72. As a consequence of the low work function of aluminum, the contact resistance between the aluminum layer 32 and the n-type gallium nitride layer 72 is relatively low, and so the overall p-contact 30' exhibits improved electrical characteristics.

Figure 3:
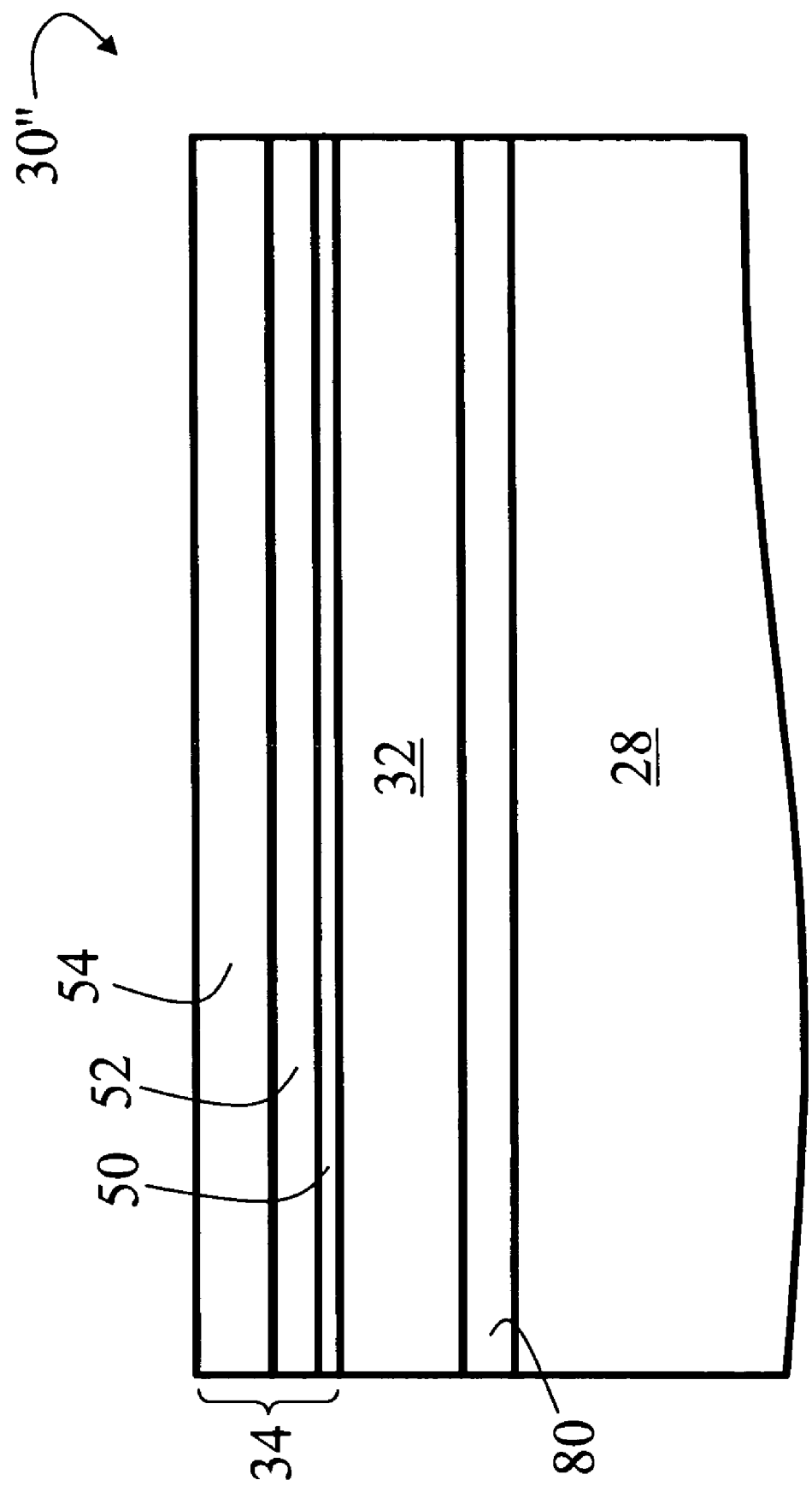
FIG. 3 shows a cross-sectional view of yet another embodiment of a p-contact which employs an interposed p-InGaN layer.

With reference to FIG. 3, in yet another embodiment of the p-contact 30'', the semiconductor layers 22 include a p-type indium gallium nitride (InGaN) layer 80 deposited on the top p-type group III-nitride layer 28 during the growth of the semiconductor layers 22. To minimize light absorption in the lower bandgap p-type InGaN layer 80, the layer 80 is preferably kept thin, such as a few nanometers or tens of nanometers thick. The aluminum layer 32 is formed on the p-type InGaN layer 80. The bonding stack 34 is optionally formed on the aluminum layer 32 as before.

The p-contact 30'' operates as follows. The low bandgap InGaN 80 reduces the electrical barrier between the InGaN 80 and the aluminum layer 32 versus direct deposition of the aluminum on gallium nitride. The reduced barrier provides more quasi-ohmic electrical communication between the top p-type group III-nitride layer 28 and the aluminum layer 32, and so the overall p-contact 30'' exhibits improved electrical characteristics.

In either p-contact 30', 30'', the HCl/piranha surface processing is optionally applied prior to forming the aluminum layer 32, to further improve electrical characteristics of the p-contact.

Figure 4:
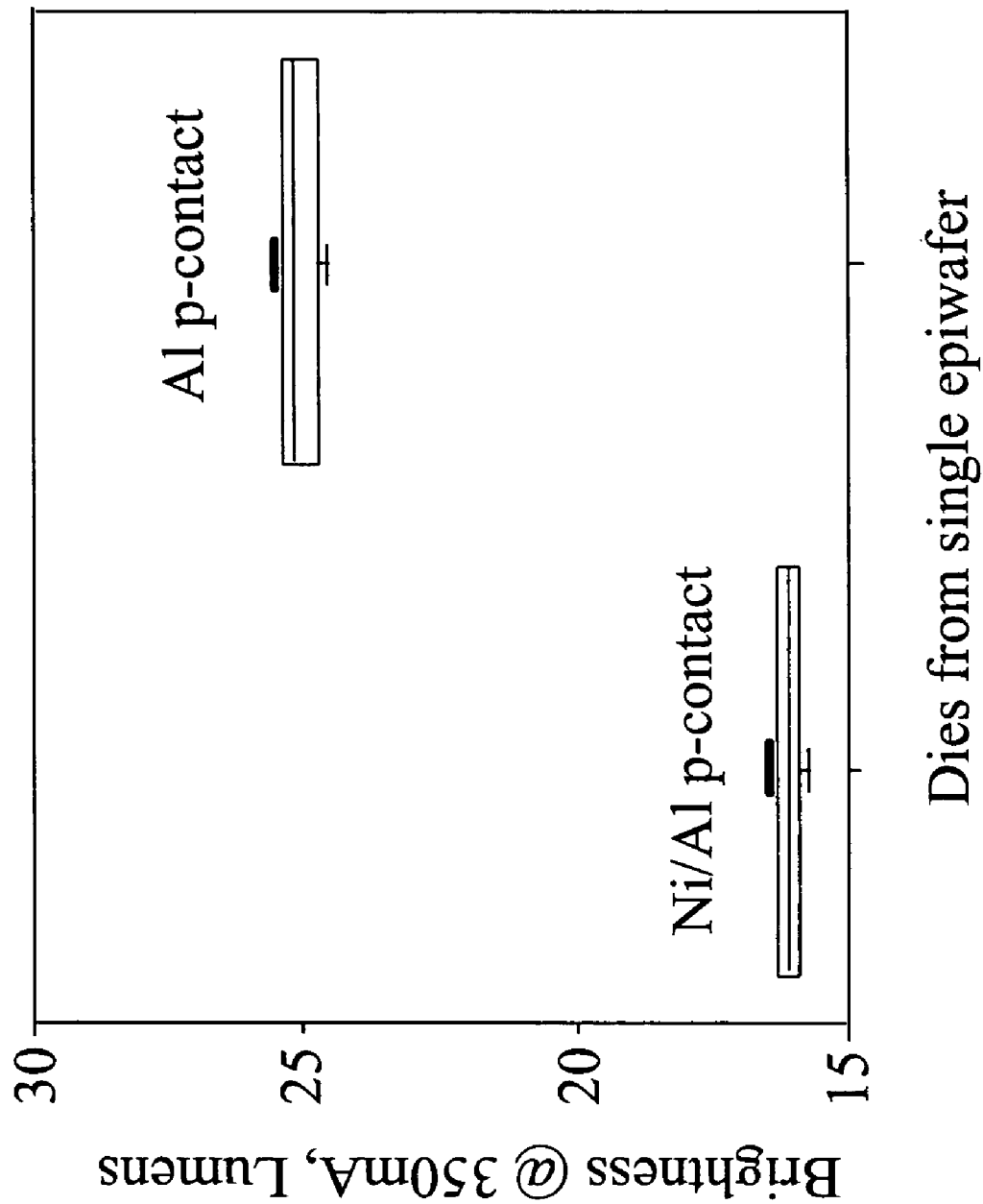
FIG. 4 compares measurements of brightness of white LEDs fabricated with nickel/aluminum based contacts (left hand side) with white LEDs fabricated from the same epitaxial wafer with aluminum contacts but otherwise similar device fabrication processing (right hand side).
Figure 5:
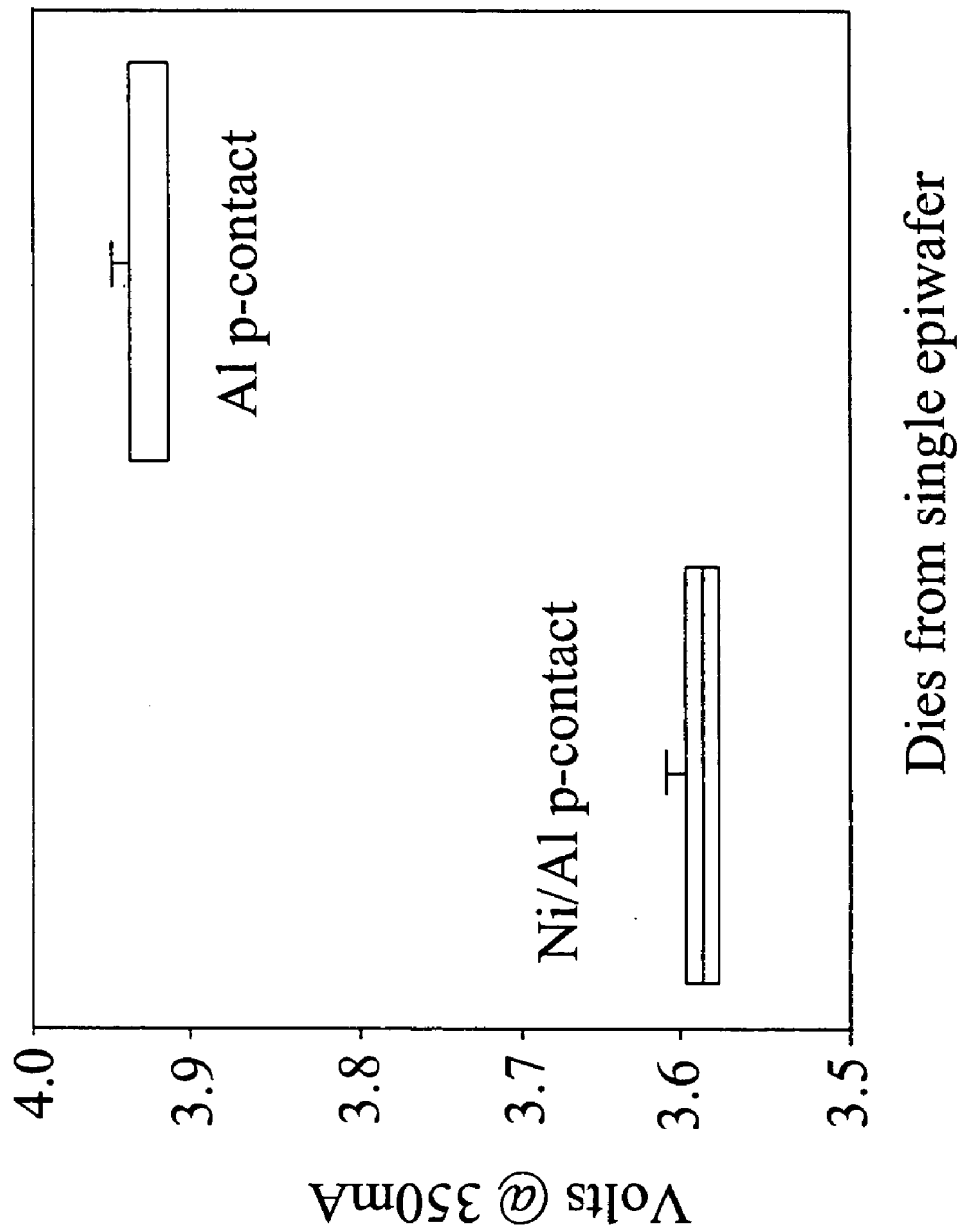
FIG. 5 compares measurements of the device voltage of white LEDs fabricated with nickel/aluminum based contacts (left hand side) with white LEDs fabricated from the same epitaxial wafer with aluminum contacts but otherwise similar device fabrication processing (right hand side).

With reference to FIGS. 4–5, white LED lamps having traditional nickel/aluminum based p-contacts are experimentally compared with LED lamps in which the nickel/aluminum based p-contact was replaced with the aluminum based p-contact 30. The devices with nickel/aluminum and aluminum p-contacts were fabricated from dice cleaved from the same epitaxial wafer having blue light-emitting epitaxial layers, using identical fabrication processes except for the p-contact fabrication. The dice were similarly mounted, epoxy-encapsulated, and phosphorized using a yellow phosphor that converts some of the blue electroluminescence into yellow light to approximate white light.

As shown in FIG. 4, the brightness of the white LED was increased by 50% by replacing the nickel/aluminum p-contact with the aluminum p-contact. As shown in FIG. 5, the HCl/piranha surface processing limits the increase in the device forward voltage due to electrical resistance to about 0.3V. Overall, the luminous efficiency (output lumens/input electrical power) increased on average by 34%.

The preferred embodiments have been described. Obviously, modifications and alterations will occur to others upon reading and understanding the preceding detailed description. It is intended that the application be construed as including all such modifications and alterations insofar as they come within the scope of the appended claims or the equivalents thereof.

What is claimed is:

1. A method for forming a p-contact on a top p-type group III-nitride layer of a flip-chip LED device, the method comprising:
    forming an interface layer including a tunnel junction on the top p-type group III-nitride layer; and
    forming an aluminum layer on the interface layer;
    wherein the interface layer reduces a contact resistance between the aluminum layer and the top p-type group III-nitride layer.

2. The method as set forth in claim 1, wherein the forming of an interface layer including a tunnel junction comprises:
    forming a degenerately doped p-type group III-nitride layer; and
    forming a degenerately doped n-type group III-nitride layer on the degenerately doped p-type group III-nitride layer.

3. The method as set forth in claim 2, wherein the forming of an interface layer further comprises:
    forming a non-degenerately doped n-type group III-nitride layer on the degenerately doped n-type group III-nitride layer.

4. The method as set forth in claim 2, wherein:
    the degenerately doped p-type group III-nitride layer is selected from a group consisting of: (i) a degenerately doped p-type InGaN layer, and (ii) a degenerately doped p-GaN layer; and
    the degenerately doped n-type group III-nitride layer is selected from a group consisting of: (i) a degenerately doped n-type InGaN layer, and (ii) a degenerately doped n-GaN layer.

5. The method as set forth in claim 1, wherein the forming of an interface layer including a tunnel junction comprises:
    forming a degenerately doped p-type InGaN layer; and
    forming a degenerately doped n-type InGaN layer on the degenerately doped p-type InGaN layer.

6. A method for forming a p-contact on a top p-type group III-nitride layer of a flip-chip LED device, the method comprising:
    forming a p-InGaN interface layer on the top p-type group III-nitride layer; and
    forming an aluminum layer on the p-InGaN interface layer;
    wherein the p-InGaN interface layer reduces a contact resistance between the aluminum layer and the top p-type group III-nitride layer.

7. The method as set forth in claim 6, further comprising:
    forming one or more electrically conductive layers on top of the aluminum layer, said one or more electrically conductive layers providing one of (i) a solderable surface for flip-chip soldering, and (ii) a surface for thermocompression bonding or thermosonic bonding, the p-contact to an associated mount.

8. The method as set forth in claim 6, further comprising:
    exposing the formed p-InGaN interface layer to hydrochloric acid; and
    subsequent to the exposing to hydrochloric acid, exposing the formed p-InGaN interface layer to a piranha solution.

9. The method as set forth in claim 8, wherein the exposing to a piranha solution comprises:
    exposing the formed p-InGaN interface layer to a solution including sulfuric acid and hydrogen peroxide wherein a ratio of the sulfuric acid to the hydrogen peroxide is about 10:1.

10. A method for forming a p-contact on a top p-type group III-nitride layer of a flip-chip LED device, the method comprising:
    exposing the top p-type group III-nitride layer to hydrochloric acid;
    subsequent to the exposing to hydrochloric acid, exposing the top p-type group III-nitride layer to a piranha solution including sulfuric acid and hydrogen peroxide wherein a ratio of the sulfuric acid to the hydrogen peroxide in the solution is about 10:1; and
    subsequent to the exposing to the piranha solution, disposing an aluminum layer on the top p-type group III-nitride layer.

11. The method as set forth in claim 10, further comprising:
    prior to the exposing to hydrochloric acid, disposing a p-InGaN layer on the top p-type group III-nitride layer, the exposing processes and the depositing of the aluminum layer being applied to the p-InGaN layer.

12. The method as set forth in claim 10, further comprising:
    prior to the exposing to hydrochloric acid, disposing a tunnel junction on the top p-type group III-nitride layer.

13. The method as set forth in claim 10, wherein the solution further includes water.

14. The method as set forth in claim 10, further comprising:
 forming one or more electrically conductive layers on top of the aluminum layer, said one or more electrically conductive layers providing one of (i) a solderable surface for flip-chip soldering, and (ii) a surface for thermocompression bonding or thermosonic bonding, the p-contact to an associated mount.

* * * * *